United States Patent
Lohman et al.

(10) Patent No.: US 9,279,868 B2
(45) Date of Patent: Mar. 8, 2016

(54) DEVICE AND METHOD FOR RAPID DYNAMIC NUCLEAR POLARIZATION

(71) Applicant: Bruker BioSpin GmbH, Rheinstetten (DE)

(72) Inventors: Joost A B Lohman, Kenilworth (GB); Sami Antoine Adrien Jannin, Bremblens (CH); Werner Maas, Merrimac, MA (US)

(73) Assignee: Bruker BioSpin GmbH, Rheinstetten (DE)

( * ) Notice: Subject to any disclaimer, the term of this patent is extended or adjusted under 35 U.S.C. 154(b) by 603 days.

(21) Appl. No.: 13/723,199

(22) Filed: Dec. 21, 2012

(65) Prior Publication Data

US 2013/0168576 A1    Jul. 4, 2013

(30) Foreign Application Priority Data

Dec. 29, 2011    (GB) .................................. 1122446.6

(51) Int. Cl.
*G01R 33/28* (2006.01)
*G01R 33/381* (2006.01)

(52) U.S. Cl.
CPC ............ *G01R 33/282* (2013.01); *G01R 33/381* (2013.01)

(58) Field of Classification Search
CPC ............................ G01R 33/282; G01R 33/381
See application file for complete search history.

(56) References Cited

U.S. PATENT DOCUMENTS 7,639,007 B2 * 12/2009 Hutton et al. .................. 324/307
7,701,218 B2 *  4/2010 Noonan et al. ................ 324/319
8,703,102 B2 *  4/2014 Kalechofsky et al. .......... 424/9.3
8,703,201 B2 *  4/2014 Belzer et al. .................. 424/489
2010/0158810 A1   6/2010 Lisitza
2011/0008261 A1   1/2011 Lerche

FOREIGN PATENT DOCUMENTS

| EP | 2 028 505 | 2/2009 |
| WO | WO 99/35508 | 7/1999 |
| WO | WO 02/37132 | 5/2002 |
| WO | WO 2006/011811 | 2/2006 |
| WO | WO 2006/106285 | 10/2006 |

(Continued)

OTHER PUBLICATIONS

S.R. Hartmann et al., "Nuclear Double Resonance in the Rotating Frame" Physical Review, vol. 128, No. 5, Dec. 1, 1962.

(Continued)

*Primary Examiner* — Dixomara Vargas
(74) *Attorney, Agent, or Firm* — Paul Vincent (57) ABSTRACT

A method and apparatus for producing a hyperpolarized sample material for use in an NMR investigation provides for a cryogenic region having a target material containing a first hyperpolarizable nuclear species, a second hyperpolarizable nuclear species, and a nuclear spin polarizing agent, wherein the first nuclear species has a higher magnetic moment than the second nuclear species. Microwave energy is used to excite electron spin transitions in the polarizing agent in the presence of a magnetic field. The first hyperpolarizable nuclear species is thereby caused to interact with the electron spin system in the polarizing agent and generate hyperpolarization of at least the first nuclear species of the target material. The target material is then subjected to a lowered magnetic field, wherein the lowered magnetic field facilitates polarization transfer by nuclear thermal mixing between the species to thereby hyperpolarize the second nuclear species.

16 Claims, 3 Drawing Sheets

(56) References Cited

FOREIGN PATENT DOCUMENTS

WO WO 2011/024156 3/2011
WO WO 2011/026103 3/2011

OTHER PUBLICATIONS

Sami Jannin et al., "Low-temperature cross polarization in view of enhancing dissolution Dynamic Nuclear Polarization in NMR", Chemical Physics Letters 517 (2011), 234-236.

David G. Gadian et al., "Lanthanide chelates as relaxation switches for brute force polarisation", D.G. Gadian, Poster abstract 579, Joint Euromar 2010 and 17$^{th}$ ISMAR Conference, Florence, 2010.

A. Comment et al., "Design and Performance of a DNP Prepolarizer Coupled to a Rodent MRI Scanner", Concepts in Magnetic Resonance Part B (Magnetic Resonance Engineering), vol. 31B(4) 255-269 (2007).

* cited by examiner

DEVICE AND METHOD FOR RAPID DYNAMIC NUCLEAR POLARIZATION

This application claims Paris convention priority of GB 1122446.6 filed Dec. 29, 2011 the entire disclosure of which is hereby incorporated by reference.

BACKGROUND OF THE INVENTION

Dynamic nuclear polarization is a technique which has attracted increasing interest in recent years. Methods for dynamic nuclear polarization are described, for example, in WO-A-1999/035508, WO-A-2002/037132, and WO-A-2011/026103, the contents of which are incorporated herein by reference. The essence of the technique is to carry out a magnetic resonance investigation on a nuclear spin system (typically $^{13}$C or $^{15}$N) of which the spin polarization levels have been perturbed from their equilibrium values prior to a nuclear magnetic resonance investigation, and thereby enhance the sensitivity of the investigation. The perturbation of the spin polarization levels is achieved by interaction between an electron spin resonance transition and a nuclear spin system.

In the DNP experiment described in WO-A-1999/035508, a hyperpolarized solution of a high $T_1$ agent is produced by dissolving a hyperpolarized solid sample of the high $T_1$ agent in a physiologically tolerable solvent. The hyperpolarization of the solid sample is effected by means of a polarizing agent, which may be at least partially separated from the high $T_1$ agent after use. The sample is then administered, for example by injection, to a patient, and is then irradiated using a second rf to excite nuclear spin transitions in selected nuclei e.g. the MR imaging nuclei of the high $T_1$ agent. Magnetic resonance signals are detected and NMR spectral data, an image, dynamic flow data, diffusion data, perfusion data, physiological data may be measured. The long $T_1$ results in persistence of the nuclear spin polarization, allowing significantly enhanced sensitivity in the NMR determination to be achieved over a useful time period.

One disadvantage of this approach is the relatively long polarization time (typically of the order of thirty minutes or more).

SUMMARY OF THE INVENTION

According to the present invention, there is provided a method for producing a hyperpolarized sample material for use in an NMR investigation, comprising:—
(a) providing a cryogenic region;
(b) providing a target material containing a first hyperpolarizable nuclear species, a second hyperpolarizable nuclear species, and a nuclear spin polarizing agent in the first cryogenic region, wherein the first hyperpolarizable nuclear species has a higher magnetic moment ($\gamma$), than the second hyperpolarizable nuclear species;
(c) supplying microwave energy to the first cryogenic region to excite electron spin transitions in the polarizing agent in the presence of a magnetic field (B0),
(d) causing the first hyperpolarizable nuclear species to interact with the electron spin system in the polarizing agent thereby generating hyperpolarization of at least the said first nuclear species of the target material; and
(e) subjecting the target material to a lowered magnetic field, wherein the lowered magnetic field is such as to facilitate polarization transfer by means of nuclear thermal mixing between the first hyperpolarizable nuclear species and the second hyperpolarizable nuclear species, thereby to effect hyperpolarization of the second nuclear species. The first hyperpolarizable nuclear species, having a higher magnetic moment ($\gamma$) than the second hyperpolarizable nuclear species is preferably present in greater abundance than the second hyperpolarizable nuclear species.

The invention also provides apparatus for producing a hyperpolarized sample material for use in an NMR investigation, comprising:—
a first cryogenic region;
means for locating a target material containing a first hyperpolarizable nuclear species and a second hyperpolarizable nuclear species, and a nuclear spin polarizing agent in the first cryogenic region;
a first magnet, for generating a magnetic field (B0) in the first cryogenic region;
means for supplying microwave energy to the first cryogenic region to excite an electron spin state of the target material in the presence of the magnetic field (B0), and thereby hyperpolarizing at least the said first nuclear species; and
a second magnet, spaced from the first magnet, and having a magnetic field opposed to the field produced by the first magnet, thereby to produce a region of approximately zero magnetic field in a second region, lying between the first cryogenic region and the second magnet; and
means for moving the target material from the first cryogenic region through the second region, thereby to facilitate transfer of nuclear polarization from the first hyperpolarizable nuclear species to the second hyperpolarizable nuclear species.

In a particularly preferred embodiment, the first, hyperpolarizable nuclear species is $^1$H. The low $\gamma$/long $T_1$ nuclear species may be, for example $^{19}$F, $^6$Li, $^{13}$C, $^{15}$N, $^{29}$Si, $^{89}$Y, or $^{31}$P. $^{13}$C and $^{15}$N are particularly preferred.

The use of a relatively high $\gamma$/short $T_1$ nuclear spin such as as the initial polarization target, followed by polarization transfer to the low $\gamma$/long $T_1$ nuclear spin can be achieved, in accordance with the invention, by nuclear thermal mixing (i.e. thermal mixing between two nuclear species) at low field whereby the two nuclear species reach a common spin temperature (A. Abragam, *The Principles of Nuclear Magnetism*, Clarendon Press, Oxford, 1960). Other methods are known for effecting polarization transfer between two species, for example by the application of appropriate RF pulses to the two spin systems, (e.g. Hartmann-Hahn matched spin-lock pulses or other cross polarization pulse sequences) at constant $B_0$ (S. R. Hartmann, E. L. Hahn, *Phys. Rev.* 128, 2042 (1962)). Although such methods may be effective in a less technically challenging environment, the application of a sufficiently strong RF field at two frequencies in a cryogenic region necessitates the use of more complex instrumentation (Sami Jannin, Aurélien Bornet, Sonia Colombo, and Geoffrey Bodenhausen, *Chem. Phys. Lett.,* (2011) (doi.org/10.1016/j.cplett.2011.10.042).

In accordance with the invention therefore, the magnetic field to which the target material is subjected is lowered, in order to facilitate equilibration of the spin temperatures of the two species. In a first embodiment of the invention, the magnetic field to which the target material is subjected is lowered by actually lowering the $B_0$ field to a suitable low value. In practice, rapidly switching the field of a high power superconducting magnet is very difficult to achieve. In a much preferred embodiment of the invention therefore, the magnetic field to which the target material is subjected is lowered by physically moving the target material from the first ($B_0$) region, to a second region, in which the magnetic field is sufficiently low to effect nuclear thermal mixing, i.e. sufficiently low for the Zeeman energy of the two nuclear species to be of comparable or smaller magnitude than their dipolar coupling energy. This condition will be met in most practical situations if the field strength is of the order of 100 µT or less (note that the earth's magnetic field is in the order of 30-60 µT). For convenience in the following discussion, the second region in which the field is sufficiently low to effect nuclear thermal mixing is referred to as a "mixing field" region.

The provision of the "mixing field" region may be achieved by providing a second magnet, having a magnetic field which is opposed in direction to the field direction of the magnet which provides the $B_0$ field, so that a region of low or zero field (not substantially different from the earth's magnetic field) results between the first and second magnet.

Previous work in this area, in particular in the references discussed above, suggests that bulk polarization is lost rapidly if the sample (either in the solid or in the liquid state) traverses a field of zero or very low field. The present invention is based on the realization that the polarization loss observed in dissolution DNP when a sample traverses a region of zero field, is likely to be caused by thermal mixing. When low abundant low γ (long $T_1$) spins are hyperpolarized by DNP, and their spin temperature is allowed to equilibrate with abundant proton spins at thermal equilibrium by nuclear thermal mixing at low field, the spin temperature of the long $T_1$ nucleus will be greatly increased, and thereby the hyperpolarization of the long $T_1$ spins is lost.

In accordance with the method of this invention, initial dynamic nuclear polarization of high γ (short $T_1$) nuclear spin species (typically $^1$H) is initially carried out, followed by subjecting the target (comprising the high γ/short $T_1$ nuclear spins and the low γ/long $T_1$ nuclear spins) to a period at low or zero field, thereby hyperpolarizing the low γ/long $T_1$ nuclear spin species (typically $^{13}$C or $^{15}$N) by equilibration of the spin temperatures of the two species. Polarization of the high γ nuclear spins is possible in a significantly shorter time that is required for the long $T_1$ nuclei, thereby significantly increasing the speed of the polarization process.

In a preferred embodiment, the low-gamma nuclei may be also be subjected to some polarization by DNP at the same time as the high gamma nuclei are polarized (by the selection of two different microwave frequencies for excitation). This dual excitation can enhance the overall polarization level.

In an alternative embodiment, a polarizing agent may be selected that has a relatively broad electron resonance peak, such as 2,2,6,6,tetramethylpiperidine-1-oxyl ("Tempo"), that can simultaneously polarize both nuclear spin species.

Once the highly polarized sample material has been formed in the solid state, a solution may be formed, by dissolving the material containing the second, long $T_1$, hyperpolarizable nuclear spin species (referred to herein as the "long $T_1$ agent"), in a suitable solvent, with or without separation from the target material, in the manner disclosed generally in WO-A-1999/035508. Typically, an injectable solution may be formulated from the hyperpolarized second nuclear species, which can be injected directly into an animal (for example a patient) prior to carrying out a nuclear magnetic resonance investigation, at enhanced signal levels. The long $T_1$ agent should therefore be capable of being provided in a form in which it is physiologically tolerable, and easily administered. The long $T_1$ agent is preferably soluble in aqueous media (e.g. water) and is physiologically non-toxic.

The long $T_1$ agent should be such that it remains polarized for a period sufficiently long to allow an imaging or other MR investigation to be carried out. This can generally be achieved if the material has a $T_1$ value (at a field strength of 0.01-5T and a temperature in the range 20-40° C.) of at least 5s, more preferably at least 10s, especially preferably 30s or longer, more especially preferably 70s or more, yet more especially preferably 100s or more (for example at 37° C. in water at 1T and a concentration of at least 1 mM).

$^{13}$C is particularly suitable for use as the second hyperpolarizable nuclear species, for the reasons discussed in WO-A-1999/035508

In a further preferred embodiment, steps (c) to (e) above may be repeated one or more times (i.e., the polarization and nuclear thermal mixing steps may be cycled) so as to increase the polarization effect.

The principle of DNP Using nuclear thermal mixing may be illustrated by the following specific example. The thermal equilibrium polarization of a spin ½ nuclear species S in a strong magnetic field can be described by the following expression:

$$P_S = \tanh\left(\frac{\Delta E_S}{2kT}\right) \quad (1)$$

in which $\Delta E_S$ is the Zeeman energy of the nuclear species S, k Boltzmann's constant, and T the lattice temperature. If the polarization of the nuclear spin species has been enhanced by means of hyperpolarization, then the non-equilibrium polarization level $P^*_S$ can be characterized by defining a "spin temperature" $T_S$ different from the lattice temperature T by:

$$P^*_S = \tanh\left(\frac{\Delta E_S}{2kT_S}\right) \quad (2)$$

Consider now two nuclear species exposed to a strong magnetic field whereby one is hyperpolarized, i.e. its spin temperature is substantially lower than the lattice temperature. If the field is adiabatically reduced to a very small value, i.e. a value where the Zeeman energy of the two nuclear species is comparable or smaller than their dipolar interaction energy, then the two spin baths will reach a common spin temperature. When, subsequently, the field is again increased to the original value, then the common spin temperature with reference to the high field is given by:

$$\frac{1}{T} = \frac{1/T' + \mu/T''}{1 + \mu} \quad (3)$$

in which T' and T" are the initial spin temperatures of the two nuclear species and T is the common spin temperature. With N the number of spins and γ the gyromagnetic ratio, then for spins ½ the constant µ is defined as:

$$\mu = \frac{\gamma''^2 N''}{\gamma'^2 N'} \quad (4)$$

For example in a molecule with one $^{13}$C nucleus and ten protons, if the carbon has been hyperpolarized to e.g. 30% (corresponding to a spin temperature of 3 mK @ 3.35T) and equilibrates with protons with the proton spin temperature equal to the lattice temperature of, say, 1.5 K, then the equilibrium spin temperature will be about 350 mK, which corresponds to a carbon polarization of approximately 0.25%. It can be seen therefore that more than 99% of the original polarization is lost.

By contrast, if protons are polarized to a spin temperature of 3 mK @ 3.35T, which can be achieved in a relatively short time (typically a few minutes) and in that short time polarization of $^{13}C$ is also built up to, say, 5% (corresponding to ~20 mK), then the equilibrium spin temperature after nuclear thermal mixing at low field would be slightly higher than 3 mK. The carbon polarization would therefore be enhanced to approximately 25%.

Re-distribution of the polarization in nuclear thermal mixing takes place amongst all the nuclei in the sample. In order to obtain maximum enhancement of the $^{13}C$ polarization, it is therefore not only advantageous to maximize the number of protons such as to benefit from a larger bath of cold spins according to expression (4), but also to restrict the number of other nuclei in the sample. As a consequence it is preferred to use protonated, rather than deuterated solvents. (It is common practice in dissolution DNP to use deuterated solvents).

Simultaneous DNP of protons and carbon can be accomplished by choosing a suitable radical for interaction with the nuclear spins, or by modulation of the microwave frequency such as to give power bands at the appropriate frequencies for protons and carbon DNP.

Radicals suitable for use in DNP are generally known in the art. Examples of suitable free radical are: (2,2,6,6-tetramethylpiperidin-1-yl)oxidanyl ("TEMPO") or derivatives such as 4-amino-TEMPO (as described in WO-A-1999/035508) and Triarylmethyl and related radicals such as tryphenylmethyl (Trityl) (as described in WO-A-2006011811).

Targets well known in the art are intermediates in metabolic cycles, for example fumaric acid and pyruvic acid as preferred contrast agents for the imaging of metabolic activity. Other possible agents suitable for hyperpolarization and subsequent use as MR contrast agents are non-endogenous and endogenous compounds such as acetates, pyruvates, oxalates or gluconates, sugars, (such as glucose or fructose), urea, amides, amino acids (for example glutamate, glycine, cysteine or aspartate), nucleotides, vitamins (for example ascorbic acid), penicillin derivates and sulfonamides. Similarly suitable substances are the so-called "neurochemical agents" described in WO 2011024156, and the materials described in US-A-20110008261. Many other substances can be advantageously hyperpolarized and used according to the invention.

The mechanism of transferring polarization from proton to carbon by nuclear thermal mixing has been demonstrated in a brute force hyperpolarization field cycling experiment. In this experiment nuclear thermal mixing was shown to be effective in transferring polarization from $^1H$ to $^{13}C$ during the ramping of the magnetic field from −3.4T to +3.4T. (D. G. Gadian, *Poster abstract* 579, *Joint Euromar* 2010 *and* 17$^{th}$ *ISMAR Conference,* Florence, 2010)

The sample can be exposed to the mixing field by expelling it from the polarizer magnet by means of fluid pressure, for example by means of compressed helium gas, as proposed in WO2011/026103.

Alternatively a field cycling polarizer magnet can be used. The latter has the advantage that the polarization transfer step can be repeated, to bring the carbon spin temperature even closer to that of the protons.

A number of preferred embodiments of the invention will now be described with reference to the accompanying drawings, in which.

BRIEF DESCRIPTION OF THE DRAWING

DESCRIPTION OF THE PREFERRED EMBODIMENT

Figure 1:
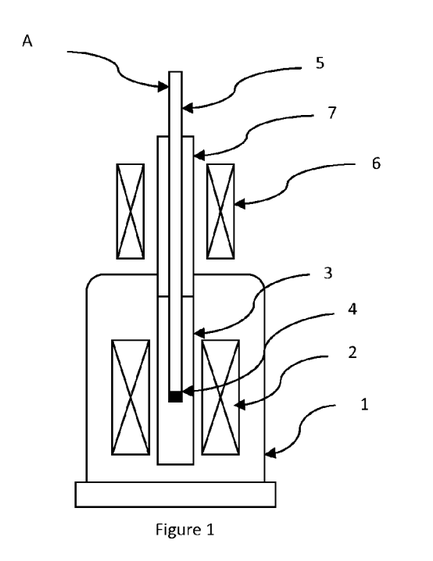
FIG. 1 is a schematic representation of a first embodiment of the invention, with the target material positioned in a magnetic field $B_0$.

Referring first to FIG. 1, The device comprises a high field superconductive polarization magnet (2) inside a cryostat (1). The field strength is usually at least 1 T and may be as high as current technology permits, which currently is of the order of 20T. Field strengths of 3.35 T or 6.7 T, may be particularly convenient, because they permit the use of microwave apparatus for excitation which is readily commercially available. Higher field strengths such as for instance 9.4 T or higher may afford higher levels of polarization. This higher level of polarization comes in general at the price of much slower polarization build-up due to the higher values of the $T_1$ relaxation times at high field. The substantial reduction in polarization build-up time for the long $T_1$ nuclear spin species in accordance with the present invention mitigates this problem and allows DNP hyperpolarization with an acceptable polarization build-up time even at high field.

A low temperature cryostat (3) is located inside the magnet. The cryostat is preferably of a type which can reach a temperature of as low as 1.5 K, or down to 1 K. Lower temperatures enable higher levels of polarization to be achieved, but give rise to significantly increased complexity (and therefore cost) in the design of the cryostat. In particular, temperatures below 4.2 K require the use of helium evaporation techniques which necessitates the use of pumping equipment and may result in the cryostat operating at sub-atmospheric pressure. In situations in which a sufficient level of polarization can be achieved without the need for temperatures below 4.2K therefore, there may be significant commercial advantage in operating at a temperature of 4.2K.

In a particular embodiment, a lambda point refrigerator may be used in which a two phase system is created, with the upper phase at 4.2K, and the lower phase at the lambda point of helium, i.e. at 2.2K. The pumping requirement for such a cryostat is modest and the design allows operation at atmospheric pressure. Such a cryostat offers a commercial advantage over a 1.5K cryostat while limiting the loss of polarization compared to a 4.2K cryostat.

A movable sample positioning device (5) with attached sample holder (4) is used to position the sample inside the cryostat (3) by means for instance of a pneumatic actuator or electro-mechanical drive (not shown) for polarization of the nuclear spins. This is shown as position (A) in FIG. 1. The sample positioning device (5) comprises a microwave guide coupling the sample holder (4) to a microwave source (not shown), for exciting electron spin-spin transitions of a species present in the target to enhance the nuclear spin polarization by means of DNP.

The sample, such as for example sodium acetate, in which the acetate is $^{13}C$ labeled, is subjected to DNP hyperpolarization in a manner to ensure maximum increase of the polarization of the short $T_1$ nuclear spins, i.e. the protons. It is advantageous to ensure that also the long $T_1$ ($^{13}C$) nuclear spin polarization is enhanced simultaneously by judicious choice of a broad line free radical such as for instance TEMPO. Alternatively, when using a narrow line free radical such as Trityl, the $^{13}C$ nuclei may be partly pre-polarized by employing appropriate modulation of the microwave radiation if desired, whereby microwave power bands simultaneously are provided at distances from the electron Larmor frequency corresponding to the proton and carbon Larmor frequencies.

The DNP process may be terminated as soon as the $^1H$ nuclei have reached a desired level of polarization. The polarization level of the $^1H$ nuclei is preferably at least 40% and may be as high as 100%, but is typically in the range 40-90%, more usually 50-80%. At this time, the $^{13}C$ nuclei will have become only partially polarized.

The device further comprises an auxiliary low field magnet (6) which is located above the polarization magnet (2) and has variable field strength which can be regulated from 0 mT up to 10 mT or more. The field strength in the auxiliary magnet (6) should be sufficiently high to avoid loss of polarization due to longitudinal relaxation. It should be noted that the longitudinal relaxation time $T_1$ at very low magnetic field can be very short. The polarity of the low field magnet (6) is opposite to that of the polarization magnet (2) such that between the two magnets a region exists where the fields cancel and the residual magnetic field is very low, for example less than 100 µT (i.e. approximately the same as the value of the earth's magnetic field).

Magnetic shielding (not shown) may be provided between the two magnets to shield the earth's magnetic field and thereby reduce the field strength in the low field region even further, to below 10 µT or below 1 µT or lower. One example of a magnetic shielding device is a tube of ferromagnetic material but other magnetic shielding devices known in the art may be equally effective.

An auxiliary cryostat (7) is positioned inside the auxiliary magnet (6). The temperature of the auxiliary cryostat (7) can be regulated, for example to a temperature down to 4.2 K or lower, and, in some embodiments, down to 1.5 K or even down to 1 K, and up to room temperature. Alternatively a dual region cryostat may be used, as described below with reference to FIGS. 3 and 4.

Figure 2:
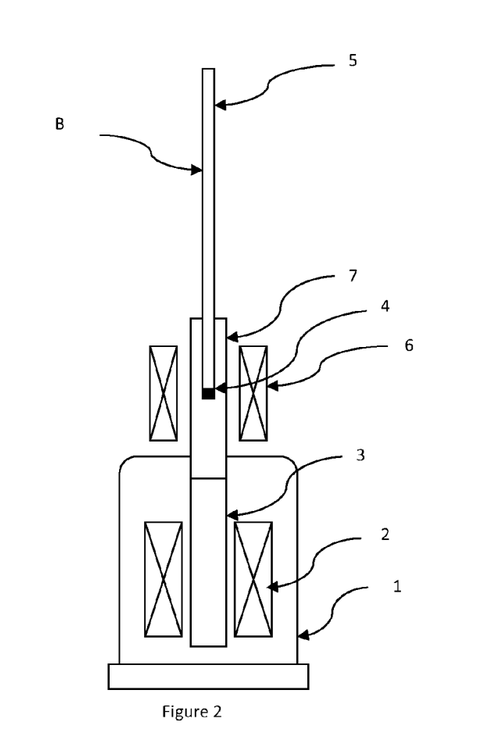
FIG. 2 shows the apparatus of FIG. 1 with the target material elevated so that it is positioned in the field of a second magnet.

After polarization, the sample in sample holder (4) is moved rapidly (i.e., generally in a time of less than 1 second) from the main cryostat (3) into the auxiliary cryostat (7), located in auxiliary magnet (6), by means of the sample positioning device (5). FIG. 2 shows the sample positioning device (5) in its upper position (B). As the sample traverses the region of low or zero field between polarization magnet 2 and auxiliary magnet 6, the polarization of the abundant $^1H$ nuclei, (which have short $T_1$/high γ) is partially transferred to $^{13}C$ nuclei (which have long $T_1$/low γ) by means of low field nuclear thermal mixing. The polarization of the $^{13}C$ nuclei is thereby enhanced.

The speed of transfer through the region of low field must be chosen judiciously so as to be sufficiently fast to avoid loss of polarization in either nuclear spin, whilst sufficiently slow to allow polarization to be transferred effectively from the short $T_1$ to long $T_1$ nuclei. The time needed for a particular experimental arrangement will vary depending on the sample type, field strength, and geometry of the apparatus, an can be determined by experiment for the particular arrangement. In general, it is found that the sample positioning device should be such that it is possible to move the sample from position (A) to position (B) in a time of 1 second or shorter, preferably 100 ms or shorter, and more preferably down to approximately 10 ms. It is generally desirable that the time spent by the sample in the mixing field region (i.e., the region in which the field strength is 100 µT or less) is 100 ms or less, more preferably 20 ms or less, even more preferably 5 ms or less.

In a preferred embodiment, said sample positioning device (5) is controlled by an electro-mechanical drive (for example a belt driven by a stepper motor), which can be programmed to move the sample at variable speed, thereby ensuring the shortest possible time is spent moving the sample from position (A) to the mixing field region and from the mixing field region to position (B) whereas, at the same time, the time spent travelling through the mixing field region is long enough to effectuate efficient polarization transfer through nuclear thermal mixing.

The magnetic field strength in the auxiliary magnet (6) and the temperature of the auxiliary cryostat (7) may be chosen such as to obtain conditions of long $T_1$ for the low γ $^{13}C$ nucleus. During or after transfer from the polarization cryostat (3) to the auxiliary cryostat (7) an optional heating element in sample holder (4) may be employed to rapidly bring the sample to the temperature of the auxiliary cryostat (7).

The effect of nuclear thermal mixing is that the short $T_1$ $^1H$ spins are brought into thermal contact with the long $T_1$ $^{13}C$ spins so that the two spin baths reach a common spin temperature. As a consequence the spin temperature of the long $T_1$ nuclei is lowered, leading to the desirable enhancement in polarization. The spin temperature of the $^1H$ nuclei is increased and polarization of these nuclei is reduced. If the original difference in spin temperatures of the two spin baths was large, it may be that after nuclear thermal mixing, the long $T_1$ nucleus has not yet reached an optimum level of polarization.

In a particularly preferred embodiment, the temperatures in the polarization cryostat (3) and the auxiliary cryostat (7) (or in the two cryogenic regions of a dual region cryostat) are substantially the same. In that case, the sample does not experience significant temperature change during the polarization transfer, and can therefore be returned to the polarization region (position (A)) for a "top-up" of the polarization level of the $^1H$ nuclei, followed by a further cycle of nuclear thermal mixing. The sample polarization level for the $^{13}C$ nuclei can thereby be further enhanced. This process can be repeated two or more times, as desired, in order to further increase the polarization level. A dual region cryostat as discussed in more detail below is particularly suitable for this purpose.

When the frozen sample has reached the auxiliary magnet (6) after the final polarization cycle, it can be rapidly dissolved or melted by means of solvent conduits in the sample positioning device (5) or the heating element in sample holder (4), or by other means, and used to formulate an injectable solution, for use in an NMR or MRI experiment.

Figure 3:
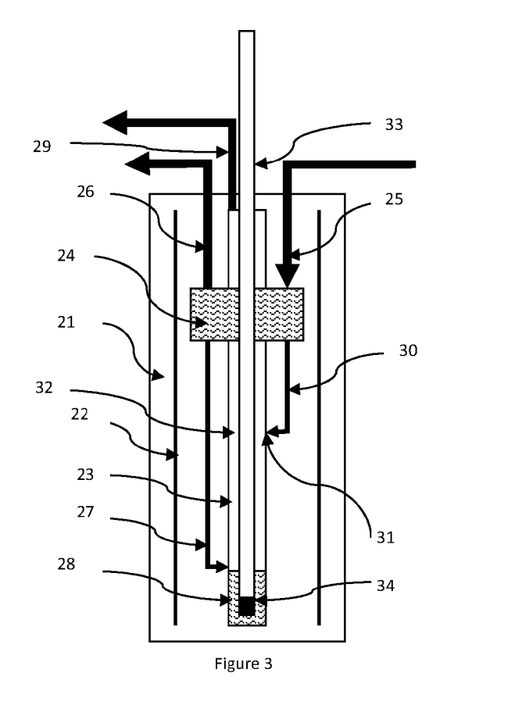
FIG. 3 is a schematic representation of a second embodiment of the invention, with the target in a lowered position in a cryostat.
Figure 4:
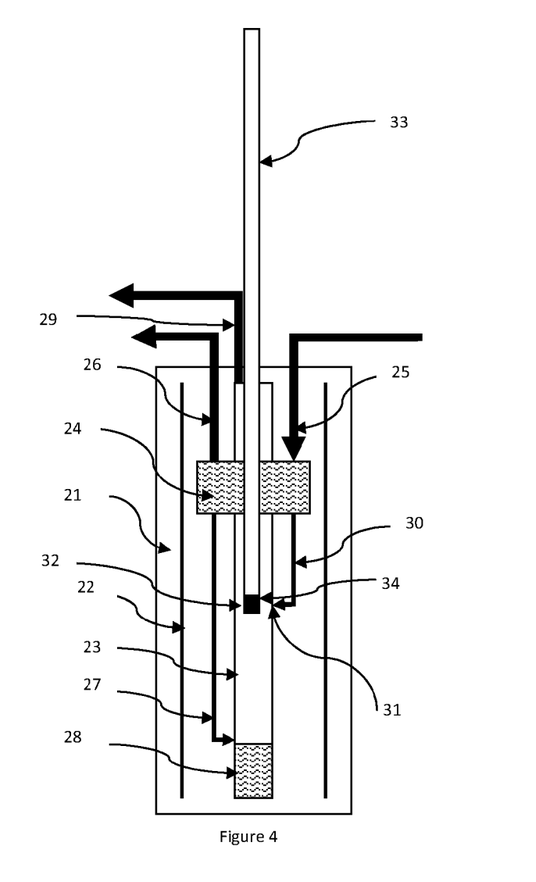
FIG. 4 shows the apparatus of FIG. 3, with the sample in a raised position.

An alternative embodiment of the apparatus is shown in FIG. 3 and FIG. 4, which utilizes two coupled regions of cryogenic temperature, between which a sample can be rapidly moved.

A first region of cryogenic temperature of about 1 K can easily be created inside a bath of liquid helium which is subjected to a pressure much lower than atmospheric pressure. This principle is described, in for example, WO-A-2006106285 (Oxford Instruments Molecular Biotools). A further example is described in "*A. Comment et al.*", *Conc. Magn. Res.* 31(B), 255, 2007. This arrangement is usually referred to as an "immersion cryostat" and in practice restricts access for loading/unloading a sample to the top part of the cryostat. If access from both ends of the cryostat is required, e.g. to load a sample from the top of the cryostat to the cryogenic region and then unloading it by moving it further down such as to exit from the bottom, or vice versa, then instead of an immersion cryostat a flow cryostat can be employed. An example of such a flow cryostat is described in EP-A-2028505 (Oxford Instruments Molecular Biotools; Nottingham University)

The device shown in FIG. 3 and FIG. 4 utilizes both of these principles in a single device, which is capable of generating two coupled regions of cryogenic temperature.

As is customary in cryogenic practice, the device comprises a series of concentric cylinders which form an outer vacuum chamber (21), in which is placed a heat shield (22), and which enclose a working volume (23). A helium vessel (24) surrounds the enclosure of working volume (23), inside vacuum chamber (21). Helium vessel (24) is connected via conduit (25) to a supply of liquid helium via a needle valve (not shown). A second conduit (26) connects helium vessel (24) to a low capacity pump (not shown) to enable vessel (24) to be filled with liquid helium.

A further, capillary, conduit (27) connects helium vessel (24) to a position close to the bottom of working volume (23) enabling the lower part of the working volume to be filled with liquid helium, thereby forming the immersion volume (28). The working volume is connected to a high capacity pump (not shown) via conduit (29) to allow the pressure in the working volume to be reduced, thereby lowering the temperature of the immersion volume (28) to a temperature lower than 4.2 K, typically as low as 1.5 K, or even as low as 1 K or lower. Control over the pumping speed and therefore the pressure and temperature can be provided by a butterfly valve or other known means (not shown).

A further capillary conduit (30) connects helium vessel (24) to a second cryogenic region (32) higher up in working volume (23). The capillary conduit (30) terminates in a spray nozzle (31) which causes a spray of cryogenic helium to enter the working volume (23), thereby creating the second cryogenic region (32) where the temperature will again be below 4.2 K, as low as 1.5 K, or even as low as 1 K or lower.

A sample can be loaded into the device by means of a sample positioning device (33) which holds a sample holder (34). The sample positioning device (33) is introduced into the low pressure working volume (23) in a generally conventional manner, by means of sliding seals and a load lock (not shown). Movement of the sample is effected by an actuator (not shown) which allows the sample to be moved rapidly between the position shown in FIG. 3, in which the sample is in the immersion region (28) and the position shown in FIG. 4, in which the sample is in the second cryogenic region (32). Polarization and nuclear thermal mixing is carried out generally by the method described with reference to FIGS. 1 and 2.

In the embodiment shown in FIGS. 3 and 4, the two cryogenic regions are closely coupled in temperature by virtue of the pumping of He gas out of the working volume. It is however possible to provide a larger degree of thermal separation between the two regions, thereby allowing the second region to be regulated at temperature that is a much higher temperature than that of the immersion region.

Figure 5:
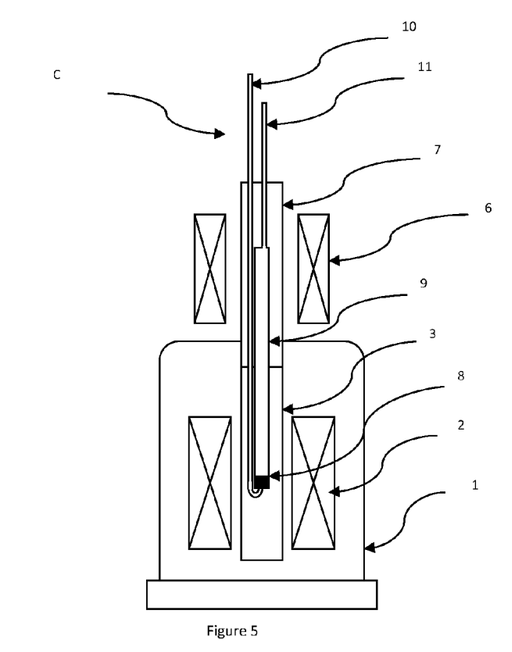
FIGS. 5 and 6 illustrate a preferred embodiment of the device according to the invention, having a sample movement device using fluid (He gas) to move the sample between magnets.
Figure 6:
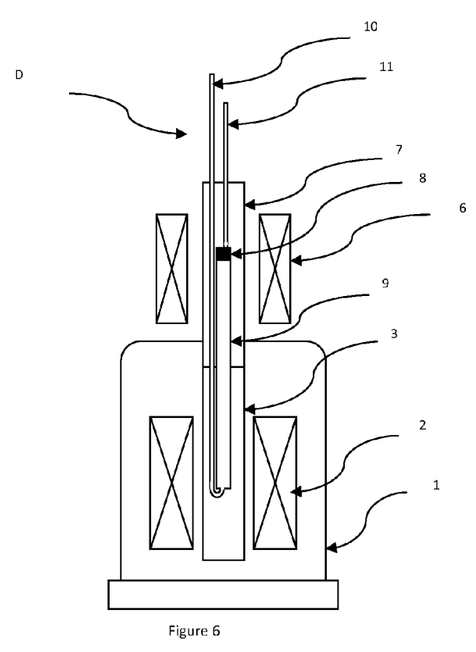

FIGS. 5 and 6 illustrate a preferred embodiment of a device according to the invention, having a sample movement device using fluid (He gas) to move the sample between magnets.

FIGS. 5 and 6 show a device of the type generally described above, and illustrated in FIGS. 1 and 2. Like reference numbers are used for the same parts as in FIGS. 1 and 2, and those parts of the device will not be further described in detail.

The devices of FIGS. 5 and 6 differ from those of FIGS. 1 and 2 in that the sample is placed in a self-contained sample holder (8) within a sample conduit (9) having a lower sample position (shown in FIG. 5) and an upper sample position (shown in FIG. 6). The sample conduit is placed inside the cryostat (3) initially with the sample holder (8) in the lower sample position, as shown in FIG. 5, such that it is placed in the center of the polarizer magnet (2) for DNP of the short $T_1$ nuclei.

After the DNP process, a pressurized gas (e.g., He) is supplied to a sample propulsion gas inlet (10). The gas pressure propels the sample holder containing the sample rapidly through a mixing field region to the upper sample position (8, FIG. 6) in sample conduit (9), which places the sample holder in the center of the auxiliary magnet (6). The transit through the mixing field region subjects the sample to low field nuclear thermal mixing.

The pressurized He gas exits via outlet (11).

It is to be understood that although the invention has been described with reference to specific embodiments, many other specific arrangements are possible, within the scope of the appended claims.

We claim:

1. A method for producing a hyperpolarized sample material for use in an NMR investigation, the method comprising the steps of:
    (a) providing a first cryogenic region;
    (b) providing a target material containing a first hyperpolarizable nuclear species, a second hyperpolarizable nuclear species and a nuclear spin polarizing agent in the first cryogenic region, wherein the first hyperpolarizable nuclear species has a higher magnetic moment (γ) than the second hyperpolarizable nuclear species;
    (c) supplying microwave energy to the first cryogenic region to excite electron spin transitions in the polarizing agent in the presence of a magnetic field ($B_0$);
    (d) causing the first hyperpolarizable nuclear species to interact with the electron spin system in the polarizing agent thereby generating hyperpolarization of at least the first nuclear species of the target material;
    (e) subjecting the target material to a lowered magnetic field, wherein the lowered magnetic field is such as to facilitate polarization transfer by means of nuclear thermal mixing between the first hyperpolarizable nuclear species and the second hyperpolarizable nuclear species, thereby to effect hyperpolarization of the second nuclear species; and
    (f) presenting the target material to a use in order to perform an NMR investigation using the second nuclear species hyperpolarized in step (e).

2. The method of claim 1, wherein the first hyperpolarizable nuclear species is $^1H$.

3. The method of claim 1, wherein the second hyperpolarizable nuclear species is $^{13}C$ or $^{15}N$.

4. The method of claim 1, further comprising the step of formulating an injectable solution comprising the hyperpolarized second nuclear species.

5. The method of claim 1, wherein lowering the magnetic field to which the target material is subjected is carried out by moving the target species from the first region through a mixing field region, in which a magnetic field strength (a so-called "mixing field") is sufficiently low that a Zeeman energy of the two nuclear species is comparable to or lower than a dipolar interaction energy thereof.

6. The method of claim 5, wherein the magnetic field $B_0$ is provided by a first magnet, and wherein a second magnet is provided, having a field opposed to the $B_0$ field, wherein the mixing field region is provided between the first magnet and the second magnet.

7. The method of claim 6, wherein the cryostat includes a second cryogenic region at cryogenic temperature, and wherein the sample is moved from the first cryogenic region to the second cryogenic region through the mixing field region.

8. The method of claim 7, wherein the second cryogenic region is located within the magnetic field of the second magnet, and further comprising the step of dissolving the target material in a liquid solvent, within the second cryogenic region.

9. The method of claim 7, wherein the first cryogenic region is provided by an immersion cryostat and the second cryogenic region is provided by a flow cryostat.

10. A method for producing a hyperpolarized sample material for use in an NMR investigation, the method comprising the steps of:
 (a) providing a first cryogenic region;
 (b) providing a target material containing a first hyperpolarizable nuclear species, a second hyperpolarizable nuclear species and a nuclear spin polarizing agent in the first cryogenic region, wherein the first hyperpolarizable nuclear species has a higher magnetic moment ($\gamma$) and is present in greater abundance than the second hyperpolarizable nuclear species;
 (c) supplying microwave energy to the first cryogenic region to excite electron spin transitions in the polarizing agent in the presence of a magnetic field ($B_0$);
 (d) causing the first hyperpolarizable nuclear species to interact with the electron spin system in the polarizing agent thereby generating hyperpolarization of at least the first nuclear species of the target material;
 (e) subjecting the target material to a lowered magnetic field, wherein the lowered magnetic field is such as to facilitate polarization transfer by means of nuclear thermal mixing between the first hyperpolarizable nuclear species and the second hyperpolarization nuclear species, thereby to effect hyperpolarization of the second nuclear species; and
 (f) presenting the target material to a user in order to perfom an NMR investigation using the second nuclear species hyperpolarizied in step (e).

11. The method of claim 10, wherein lowering the magnetic field to which the target material is subjected is carried out by moving the target species from the first region through a mixing field region, in which a magnetic field strength (a so-called "mixing field") is sufficiently low that a Zeeman energy of the two nuclear species is comparable to or lower than a dipolar interaction energy thereof.

12. An apparatus for producing a hyperpolarized sample material for use in an NMR investigation, the apparatus comprising:
 a first cryogenic region;
 an element for locating a target material containing a first hyperpolarizable nuclear species and a second hyperpolarizable nuclear species and a nuclear spin polarizing agent in the first cryogenic region;
 a first magnet, for generating a magnetic field ($B_0$) in the first cryogenic region;
 a device for supplying microwave energy to the first cryogenic region to excite an electron spin state of the target material in the presence of the magnetic field ($B_0$), thereby hyperpolarizing at least the said first nuclear species;
 a second magnet, spaced from the first magnet and having a magnetic field opposed to the field produced by the first magnet, thereby to produce, between the first cryogenic region and the second magnet, a mixing field region having a magnetic field which is sufficiently low that a Zeeman energy of the two nuclear species is comparable to or lower than a dipolar interaction energy thereof; and
 an element for moving the target material from the first cryogenic region through the mixing field region, thereby to facilitate transfer of nuclear polarization from the first hyperpolarizable nuclear species to the second hyperpolarizable nuclear species.

13. The apparatus of claim 12, wherein the cryostat includes a second cryogenic region at cryogenic temperature, and wherein an element is provided for moving the sample from the first cryogenic region to the second cryogenic region, through the mixing field region.

14. The apparatus of claim 13, wherein the first cryogenic region is provided by an immersion cryostat and the second cryogenic region is provided by a flow cryostat.

15. The apparatus of claim 12, wherein magnetic shielding is provided between the first magnet and the second magnet, to shield an earth's magnetic field, wherein a field strength in the mixing field is below 10 µT.

16. The apparatus of claim 12, wherein the element for moving the target material from the first cryogenic region through the mixing field comprises:
 (a) a pneumatic actuator;
 (b) an electro-mechanical drive; or
 (c) a conduit extending from the first cryogenic region and through the mixing field region, a sample holder slidably received in the conduit and an element for supplying a pressurized fluid to the conduit to cause the sample holder to move through the conduit from the first cryogenic region through the mixing field region.

* * * * *